(12) United States Patent
Wang et al.

(10) Patent No.: US 7,833,896 B2
(45) Date of Patent: Nov. 16, 2010

(54) ALUMINUM CAP FOR REDUCING SCRATCH AND WIRE-BOND BRIDGING OF BOND PADS

(75) Inventors: Chung Yu Wang, Hsin-Chu (TW); Chien-Hsiun Lee, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 631 days.

(21) Appl. No.: 10/948,073

(22) Filed: Sep. 23, 2004

(65) Prior Publication Data

US 2006/0063365 A1   Mar. 23, 2006

(51) Int. Cl.
*H01L 21/44* (2006.01)
(52) U.S. Cl. .............................. 438/612; 257/E21.507; 257/E21.511
(58) Field of Classification Search ......... 438/612–614; 257/E21.507, E21.51, E21.511
See application file for complete search history.

(56) References Cited

U.S. PATENT DOCUMENTS

| | | | | |
|---|---|---|---|---|
| 4,176,443 A * | 12/1979 | Iannuzzi et al. | | 438/106 |
| 5,329,423 A * | 7/1994 | Scholz | | 361/760 |
| 5,336,929 A * | 8/1994 | Hayashi | | 257/772 |
| 5,384,284 A | 1/1995 | Doan et al. | | |
| 5,470,789 A * | 11/1995 | Misawa | | 438/643 |
| 5,785,236 A * | 7/1998 | Cheung et al. | | 228/180.5 |
| 5,930,664 A * | 7/1999 | Hsu et al. | | 438/612 |
| 6,114,243 A * | 9/2000 | Gupta et al. | | 438/687 |
| 6,157,078 A * | 12/2000 | Lansford | | 257/734 |
| 6,171,960 B1 * | 1/2001 | Lee | | 438/687 |
| 6,191,023 B1 | 2/2001 | Chen | | |
| 6,229,220 B1 * | 5/2001 | Saitoh et al. | | 257/780 |
| 6,251,774 B1 * | 6/2001 | Harada et al. | | 438/637 |
| 6,274,499 B1 * | 8/2001 | Gupta et al. | | 438/692 |
| 6,329,722 B1 * | 12/2001 | Shih et al. | | 257/786 |
| 6,362,531 B1 | 3/2002 | Stamper et al. | | |
| 6,373,137 B1 | 4/2002 | McTeer | | |
| 6,376,353 B1 | 4/2002 | Zhou et al. | | |
| 6,378,759 B1 | 4/2002 | Ho et al. | | |
| 6,383,917 B1 * | 5/2002 | Cox | | 438/637 |
| 6,417,088 B1 * | 7/2002 | Ho et al. | | 438/612 |
| 6,420,254 B1 | 7/2002 | Stamper et al. | | |
| 6,423,625 B1 * | 7/2002 | Jang et al. | | 438/614 |
| 6,451,681 B1 | 9/2002 | Greer | | |
| 6,457,234 B1 | 10/2002 | Edelstein et al. | | |
| 6,472,304 B2 | 10/2002 | Chittipeddi et al. | | |
| 6,537,912 B1 * | 3/2003 | Agarwal | | 438/687 |
| 6,614,091 B1 | 9/2003 | Downey et al. | | |
| 6,642,623 B2 | 11/2003 | McTeer | | |

(Continued)

*Primary Examiner*—David A Zarneke
(74) *Attorney, Agent, or Firm*—Slater & Matsil, L.L.P.

(57) ABSTRACT

A method of manufacturing a semiconductor device and structure thereof. The method includes providing a workpiece, the workpiece having at least one conductive pad partially exposed through an opening in a passivation layer, the passivation layer having a top surface and the opening in the passivation layer having sidewalls. A barrier layer is formed over the at least one conductive pad, wherein the barrier layer lines the sidewalls of the opening in the passivation layer and is disposed over a top portion of the passivation layer proximate the opening. A conductive cap is formed over the barrier layer within the opening in the passivation layer, and the conductive cap is recessed to a height below the top surface of the passivation layer. The conductive cap may be used for testing with a probe or may be used for wire-bonding.

14 Claims, 4 Drawing Sheets

U.S. PATENT DOCUMENTS

| | | |
|---|---|---|
| 6,650,021 B2 | 11/2003 | Stamper et al. |
| 6,705,512 B2 * | 3/2004 | Ho et al. .................. 228/180.5 |
| 6,706,625 B1 * | 3/2004 | Sudijono et al. ............ 438/637 |
| 6,709,965 B1 * | 3/2004 | Chen et al. .................. 438/612 |
| 6,710,460 B2 * | 3/2004 | Morozumi .................. 257/779 |
| 6,774,027 B2 * | 8/2004 | Kobayashi .................. 438/612 |
| 6,794,248 B2 * | 9/2004 | Hashimoto et al. .......... 438/258 |
| 6,800,555 B2 * | 10/2004 | Test et al. .................... 438/687 |
| 6,806,578 B2 * | 10/2004 | Howell et al. ............... 257/762 |
| 6,881,664 B2 * | 4/2005 | Catabay et al. ............. 438/631 |
| 6,987,057 B2 * | 1/2006 | Lee et al. .................... 438/612 |
| 7,098,126 B2 * | 8/2006 | Hsieh et al. ................. 438/614 |
| 7,129,132 B2 * | 10/2006 | Tanaka et al. ............... 438/244 |
| 7,242,097 B2 * | 7/2007 | Hua ........................... 257/767 |
| 7,345,358 B2 * | 3/2008 | Akram ....................... 257/673 |
| 2003/0173667 A1 | 9/2003 | Yong et al. |
| 2005/0074959 A1 * | 4/2005 | Burrell et al. ............... 438/617 |
| 2005/0206007 A1 * | 9/2005 | Li et al. ...................... 257/762 |

* cited by examiner

ALUMINUM CAP FOR REDUCING SCRATCH AND WIRE-BOND BRIDGING OF BOND PADS

TECHNICAL FIELD

The present invention relates generally to semiconductor devices, and more particularly to the formation of bond pads of integrated circuits.

BACKGROUND

Semiconductor devices are fabricated by depositing and patterning one or more conductive, insulating, and semiconductor layers to form integrated circuits. Some integrated circuits have multiple layers (or multilevels) of interconnect, which results in the ability to manufacture more die per wafer. The top interconnect level comprises or is connected to bond pads, which are used to connect the semiconductor devices to other die, e.g., in a multi-chip module, or to leads of a package, as examples.

As semiconductor devices are scaled down in size, the propagation delay, or the RC delay, becomes a concern. To reduce this delay, there is a trend in the semiconductor industry towards the use of copper for interconnect layers of semiconductor devices, to reduce the capacitance between conductive lines. Integrated circuit (IC) technology has migrated into copper (Cu) trace circuits with 0.15 μm, 0.13 μm or even more advanced generic schemes using a top metal pad using copper metal instead of aluminum (Al) bond pads, as was common in prior semiconductor technology.

However, copper oxidation linearly grows through the inner copper matrix and is not self-limiting as is the case with aluminum bond pads, since dense aluminum oxide prevents moisture from penetrating therethrough and permitting continued aluminum oxidation. Thus, an aluminum cap is sometimes formed over copper traces, and wires are then bonded directly to the aluminum cap. Not only does aluminum form a self-limiting oxide, often it is difficult to wire bond directly to copper, and having an aluminum cap over copper pads makes it easier to wire bond to an integrated circuit.

FIG. 1 shows a cross-sectional view of prior art aluminum caps 106 and 108 formed over copper lines or bond pads 112 and 114. A workpiece 110 having a plurality of copper bond pads 112 and 114 formed thereon within an insulating layer 102 is provided. The aluminum caps 106 and 108 extend over the edge regions of a top passivation layer 104 proximate the aluminum caps 106 and 108, as shown. The aluminum caps 106 and 108 formed over the copper bond pads 112 and 114 protect the copper bond pads 112 and 114 from oxidation and also facilitate a wire bond connection. Prior art aluminum caps 106 and 108 are typically formed upon pure copper bond pads 112 and 114, and extend over or overhang a portion of the adjacent passivation layer 104, e.g., at 107 and 109.

A problem with the prior art aluminum caps 106 and 108 is that the exposed aluminum caps 106 and 108, particularly at the overhangs 107 and 109, are easily scratched during transportation and quality control (QC) inspection handling, as examples, and may be distorted after backside grinding or wire bonding, which induces pad bridging issues, leading to electrical failures/shorts, e.g., at 111, as shown in a top view in FIG. 2. This occurs because the aluminum caps 106 and 108 are not protected by any overlying insulating or passivation layer and are thus easily scratched or damaged during normal handling/processing. The dislodged aluminum cap 106 and 108 material creates bridges and shorts 111 between adjacent bond pads 112 and 114, as shown.

Thus, what is needed in the art is a method of forming aluminum caps over bond pads of a semiconductor device in which shorts do not form between adjacent bond pads.

SUMMARY OF THE INVENTION

These and other problems are generally solved or circumvented, and technical advantages are generally achieved, by preferred embodiments of the present invention, which provide methods of forming aluminum caps over copper pads.

In accordance with a preferred embodiment of the present invention, a method of manufacturing a semiconductor device includes providing a workpiece, the workpiece having at least one conductive pad partially exposed through an opening in a passivation layer, the passivation layer having a top surface and the opening in the passivation layer having sidewalls. A barrier layer is formed over the at least one conductive pad, wherein the barrier layer lines the sidewalls of the opening in the passivation layer and is disposed over a top portion of the passivation layer proximate the opening. A conductive cap is formed over the barrier layer within the opening in the passivation layer, and the conductive cap is recessed to a height below the top surface of the passivation layer.

In accordance with another preferred embodiment of the present invention, a method of forming a bond pad for a semiconductor device includes providing a workpiece, and forming at least one conductive pad partially exposed through an opening in a passivation layer, the passivation layer having a top surface and the opening in the passivation layer having sidewalls, the at least one conductive pad being electrically connected to an element within the workpiece. A conductive cap is formed over the at least one conductive pad within the opening in the passivation layer, the conductive cap comprising aluminum. The conductive cap is isotropically etched to recess the conductive cap to a height below the top surface of the passivation layer.

In accordance with yet another preferred embodiment of the present invention, a semiconductor device includes a workpiece, the workpiece having at least one conductive pad partially exposed through an opening in a passivation layer, the passivation layer having a top surface and the opening in the passivation layer having sidewalls. A barrier layer is disposed over the at least one conductive pad, wherein the barrier layer lines the sidewalls of the opening in the passivation layer and is disposed over a top portion of the passivation layer proximate the opening. A conductive cap is disposed over the barrier layer within the opening in the passivation layer, wherein the conductive cap is recessed below the top surface of the passivation layer.

In accordance with another preferred embodiment of the present invention, a bonding system for a semiconductor device includes a conductive pad partially exposed through an opening in a passivation layer, the passivation layer having a top surface and the opening in the passivation layer having sidewalls, the at least one conductive pad being electrically connected to an element within a workpiece. A conductive cap is disposed over the at least one conductive pad within the opening in the passivation layer, the conductive cap comprising aluminum and being recessed below the top surface of the passivation layer.

Advantages of embodiments of the invention include providing a cost savings, by avoiding the need for a second passivation layer or polyimide re-passivating coating over the top passivation layer. No additional masks are required to form the recessed conductive cap over the conductive pads. None of the recessed conductive cap is exposed above the top surface of the passivation layer, and thus, the recessed conductive caps are not subject to scratching or damage. In particular, because the conductive caps are recessed, the conductive caps are not subject to distortion during probing, and there is no pad bridging during handling, wire-bonding or transportation.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in a semiconductor device. Embodiments of the invention may also be applied, however, to other applications having bond pads for wiring various components of electrical devices.

Figure 3:
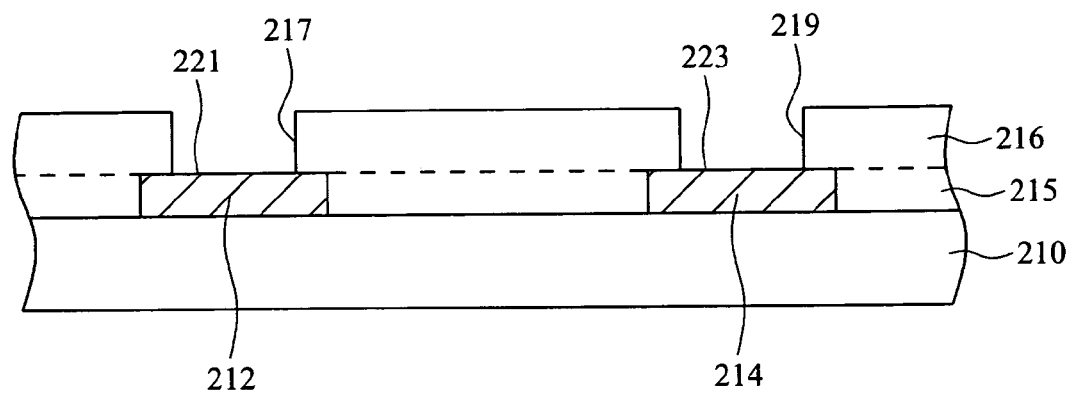
FIGS. 3 through 7 show a cross-sectional view of a semiconductor device at various stages of manufacturing in accordance with a preferred embodiment of the present invention, wherein a recessed aluminum cap is formed over conductive bond pads of a semiconductor device.

With reference now to FIG. 3, a workpiece 210 is provided. The workpiece 210 may include a semiconductor substrate comprising silicon or other semiconductor materials covered by an insulating layer, for example. The workpiece 210 may also include other active components or circuits 210 formed therein. The workpiece 210 may comprise silicon oxide over single-crystal silicon, for example. The workpiece 210 may include one or more conductive layers or other semiconductor elements, e.g. transistors, diodes, etc. (not shown). There may be four or more metallization layers formed over the workpiece 210, for example, not shown. Compound semiconductors, GaAs, InP, Si/Ge, or SiC, as examples, may be used in place of silicon. The workpiece 210 may include active and passive devices formed within the workpiece 210 (not shown), and may include a plurality of other layers such as inter-poly oxide (IPO) or intermetal dielectric (IMD) layers (also not shown).

One or more conductive bond pads 212 and 214 are formed over the workpiece 210 in an upper material layer 215, as shown. The conductive bond pads 212 and 214 are also referred to herein as conductive pads, bond pads, or pads. The conductive bond pads 212 and 214 may comprise conductive lines or bond pads formed in a top conductive layer of a semiconductor device, for example. The conductive bond pads 212 and 214 preferably make electrical contact to active or passive components within the workpiece 210, for example (not shown in the figures).

The conductive bond pads 212 and 214 preferably comprise copper or a copper alloy, in a preferred embodiment of the present invention, although alternatively, the conductive bond pads 212 and 214 may alternatively comprise other conductive materials, for example. The conductive bond pads 212 and 214 may comprise AlSiCu in one embodiment, for example. Embodiments of the present invention particularly derive technical advantages when utilized with bond pads 212 and 214 comprising copper or other materials that are not as well suitable for wire bonding as is aluminum, for example. The conductive bond pads 212 and 214 preferably are substantially square or rectangular, and may comprise a length and a width of about 30 to 120 μm, and more preferably comprise a length and width of about 40 to 80 μm, as examples, although alternatively, the conductive bond pads 212 and 214 may comprise other shapes and dimensions.

The conductive bond pads 212 and 214 may be formed in a damascene process, for example. In a damascene process, an insulating layer 215 (shown in phantom) comprising silicon dioxide, silicon nitride, or other insulators, for example, is deposited or formed over the workpiece 210, as shown. The insulating layer 215 is patterned with a desired pattern for the conductive bond pads 212 and 214. A conductive material 212/214 such as copper is deposited over the insulating layer 215 to fill the patterns, and excess conductive material 212/214 is removed from the top surface of the insulating layer 215, using a chemical mechanical polish (CMP) process or an etch process, as examples, leaving conductive bond pads 212 and 214 formed in the insulating layer 215, as shown. Conductive bond pads 212 and 214 are preferably formed using a damascene technique when the conductive bond pads 212 and 214 comprise copper, because copper can be difficult to etch, for example.

Alternatively, the conductive bond pads 212 and 214 may be formed using a subtractive etch process. In this embodiment, a conductive material 212/214 is deposited over the workpiece, and the conductive material 212/214 is patterned using lithography techniques e.g., by depositing a photoresist and/or hard mask (not shown) over the conductive material 212/214, using a lithography mask (also not shown) to pattern the photoresist or hard mask, and then using the photoresist or hard mask as a mask while portions of the conductive material 212/214 are etched away using the photoresist or hard mask as a mask, leaving the conductive bonds pads 212 and 214 formed over the workpiece 210.

A passivation material layer or insulating layer 216 is then deposited over the conductive bond pads 212 and 214, and over exposed portions of the workpiece 210, as shown. If the conductive bond pads 212 and 214 are formed using a damascene process, the passivation material 216 is deposited over the insulating layer 215 and the conductive bond pads 212 and 214.

The passivation material layer 216 is patterned to form openings 217 and 219 in the passivation layer 216, as shown in FIG. 3, at least partially exposing the top surfaces 221 and 223 of the conductive bond pads 212 and 214, respectively. The passivation layer 216 preferably comprises an insulator such as silicon dioxide ($SiO_2$), and more preferably comprises silicon nitride (SiN), in one embodiment. The passivation layer 216 may alternatively comprise other insulating materials, for example. The passivation layer 216 preferably comprises a thickness of about 0.3 to about 2 μm, and more preferably comprises a thickness of about 0.6 to 1.4 μm, in one embodiment.

Figure 4:
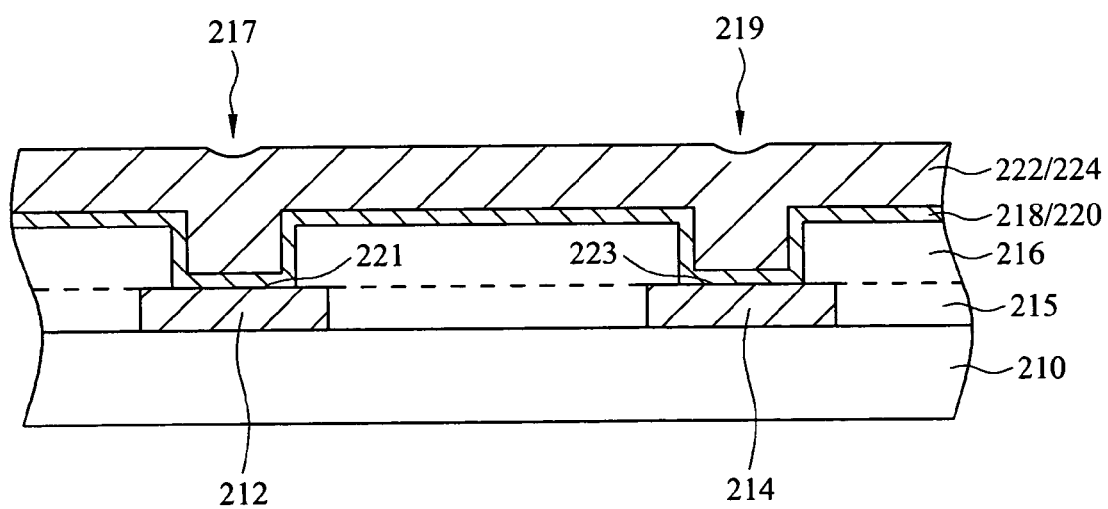

In accordance with an embodiment of the present invention, an optional barrier layer material 218/220 is formed over the exposed top surfaces 221 and 223 of the bond pads 212 and 214, respectively, as shown in FIG. 4. The barrier layer material 218/220 preferably comprises TiN, and more preferably comprises TaN in one embodiment. The barrier layer material 218/220 preferably comprises a thickness of about 2000 Å or less, and more preferably comprises a thickness of about 100 to 1000 Å in one embodiment, for example.

The barrier layer material 218/220 may be formed by depositing a barrier layer material 218/220 comprising one or more material layers. For example, the barrier layer material 218/220 may comprise a substantially thin, conformal material that evenly lines the topography of the workpiece 210, covering the top surface of the passivation layer 216, the sidewalls of the openings 217 and 219, and the exposed top surfaces 221 and 223 of the pads 212 and 214, respectively.

As shown in FIG. 4, a conductive cap material 222/224 is formed over the barrier layer material 218/220. The conductive cap material 222/224 preferably comprises aluminum (Al) or an aluminum alloy, although alternatively, the conductive cap material 222/224 may comprise a material that is wire-bondable (e.g., more wire-bondable than the material of the conductive pads 212 and 214, in one embodiment). The conductive cap material 222/224 may be deposited by sputtering or alternatively, by other deposition methods, for example. The conductive cap material 222/224 may form depressions over the openings 217 and 219, as shown.

The conductive cap material 222/224 may optionally be polished using a chemical mechanical polish (CMP) process to smooth the depressions over the openings 217 and 219, in one embodiment.

Figure 5:
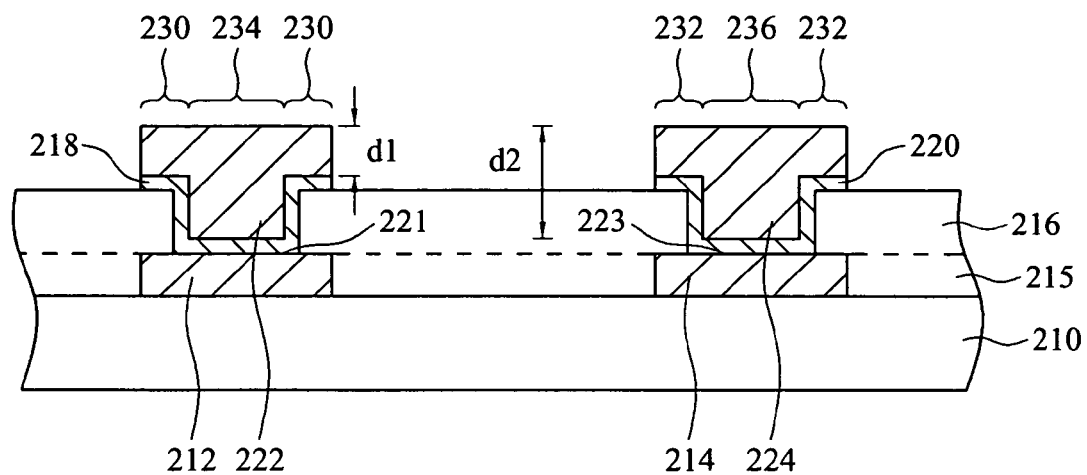

The conductive cap material 222/224 and the barrier layer material 218/220 are then patterned using lithography techniques. A photoresist or photoresist and hard mask (not shown) is/are deposited over the conductive cap material 222/224, and the photoresist or photoresist and hard mask are patterned. The photoresist or photoresist and hard mask are then used as a mask while the conductive cap material 222/224 and barrier layer material 218/220 are patterned with the desired patterns of the conductive caps 222 and 224 and barrier layers 218 and 220, forming conductive caps 222 and 224 and barrier layers 218 and 220, as shown in FIG. 5. The photoresist or photoresist and hard mask are then removed. The etch chemistry required for the conductive cap material 222/224 and barrier layer material 218/220 may be different; thus, the etch chemistry may be changed when the etching of the conductive cap material 222/224 is completed, for example. Before or after the conductive caps 222 and 224 and optional barrier layers 218 and 220 are patterned, the conductive cap material 222/224 may optionally be polished using a CMP process.

Note that after patterning the conductive caps 222 and 224 and optional barrier layers 218 and 220, a portion of the conductive caps 222 and 224 and barrier layers 218 and 220 extend over and abut a top portion of the passivation layer 216 proximate the openings 217 and 219, as shown. The optional barrier layers 218 and 220 also reside over and abut the sidewalls of the openings 217 and 219, and also extend over and abut the top surfaces 221 and 223 of the pads 212 and 214, respectively, as shown. If the optional barrier layers 218 and 220 are not included, the conductive caps 222 and 224 reside over and abut the sidewalls of the openings 217 and 219, and also extend over and abut the top surfaces 221 and 223 of the pads 212 and 214 (not shown).

The portions 230 and 232 of the respective conductive caps 222 and 224 overlying the portions of the barrier layers 218 and 220 disposed over the passivation layer 216 have a thickness of preferably from about 0.5 to 2 μm and more preferably comprise a thickness of about 0.6 to 1.0 μm. In one embodiment, the portions 230 and 232 comprise a dimension $d_1$ of about 0.8 μm or less, for example. The portions 230 and 232 of the respective conductive caps 222 and 224 preferably comprise a thickness that is less than the thickness of the portions 234 and 236 of the respective conductive caps 222 and 224 overlaying the once exposed portions 221 and 223 of the conductive pads 212 and 214, as shown. The thickness of the portions 234 and 236 of the conductive caps 222 and 224, respectively, preferably comprise about 0.5 to 1.2 μm, and more preferably comprise a thickness of about 0.6 to 0.9 μm, for example. In one embodiment, the portions 234 and 236 comprise a dimension $d_2$ of about 2 μm or less, for example.

Figure 6:
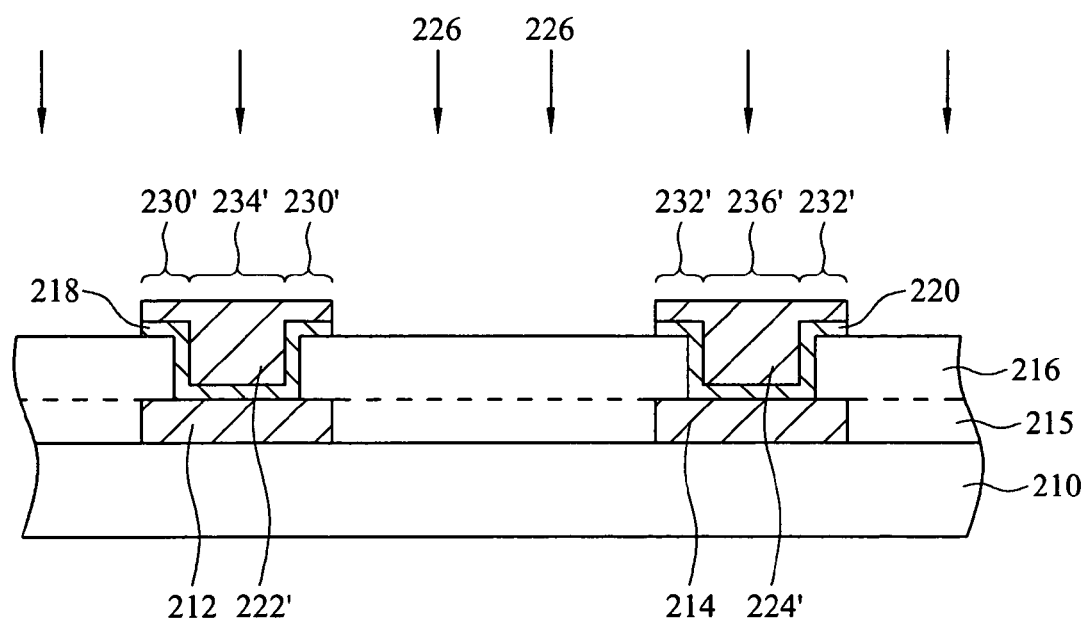

Next, as shown in FIG. 6, the conductive caps 222 and 224 are subjected to an initial spray wet etching process 226 to reduce the height of the conductive caps 222 and 224 and form recessed caps 222' and 224'. The spray wet etching process 226 is preferably isotropic, and reduces the thickness of the respective conductive caps 222 and 224 of both the portions 230 and 232 overlying the portions of the barrier layers 118 and 220 overlying the passivation layer 216, and also reduces the thickness of the portions 234 and 236 overlying the once exposed portions 221 and 223 of the conductive pads 212 and 214 to leave thinned respective conductive caps 222', 224' with thinned portions 230', 232', 234', and 236'.

Figure 7:
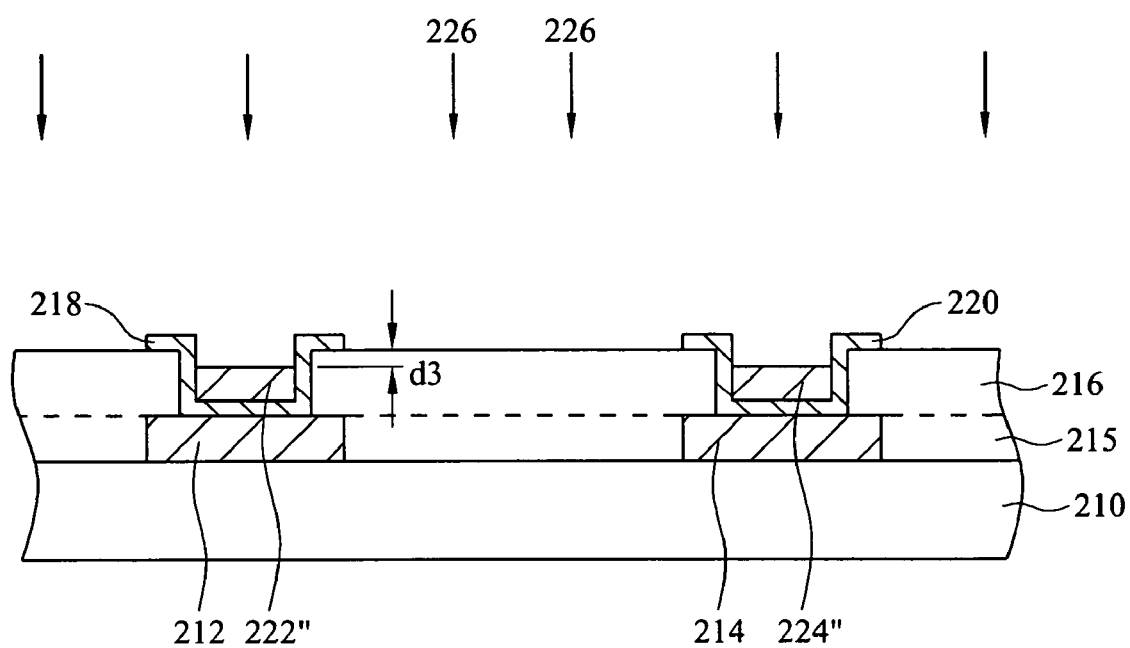

As shown in FIG. 7, the isotropic spray wet etching process 226 is continued until all of the respective conductive cap 222" and 224" portions 230 and 232, respectively, overlying the portions of the barrier layers 218 and 220 overlying the passivation layer 216 are removed, and until the respective conductive cap 222" and 224" portions 234 and 236 overlying the once exposed portions 221 and 223 of the conductive pads 212 and 214, respectively, are thinned sufficiently so that the conductive caps 222" and 224" become recessed by an amount $d_3$ below the top surface of the passivation layer 216. The dimension $d_3$ of the recess beneath the top surface of the passivation layer 216 preferably comprises about 5000 Å or less in one embodiment, although alternatively, the amount of the recess $d_3$ of the conductive caps 222" and 224" may comprise other dimensions, for example.

The etch process 226 used to remove the conductive cap material 222 and 224 from over the passivation layer 216 is preferably isotropic, etching the conductive cap material 222 and 224 substantially unidirectionally (e.g., preferably the etch process 226 is not an anisotropic etch process, which would etch more preferentially in one direction). The etch process 226 preferably comprises a spray wet etch process in one embodiment. The etch process 226 may comprise an etch process 226 using $H_3PO_4$ or $HNO_3$. For example, the etch process 226 may comprise $H_3PO_4$ or $HNO_3$ acid at a concentration of about 12% to 25% with deionized water, at a temperature of about 25 to 95° C., for a time of about 60 to 300 seconds, although alternatively, the etch process 226 may comprise other chemistries, temperatures and time periods. For example, the temperature of the etch process 226 preferably comprises a temperature of about 25 to 60° C., and the etch process time is more preferably about 120 to 240 seconds, in one embodiment.

Advantageously, the novel recessed conductive caps 222" and 224" shown in FIG. 7 are protected from damage and scratching from further processing, handling or inspection. Because the conductive caps 222" and 224" are recessed, electrical failures and shorts are prevented. Wires may be bonded directly to the conductive caps 222" and 224" to make electrical contact to the conductive pads 212 and 214 in a subsequent wire bonding process (not shown in the figures).

Figure 1:
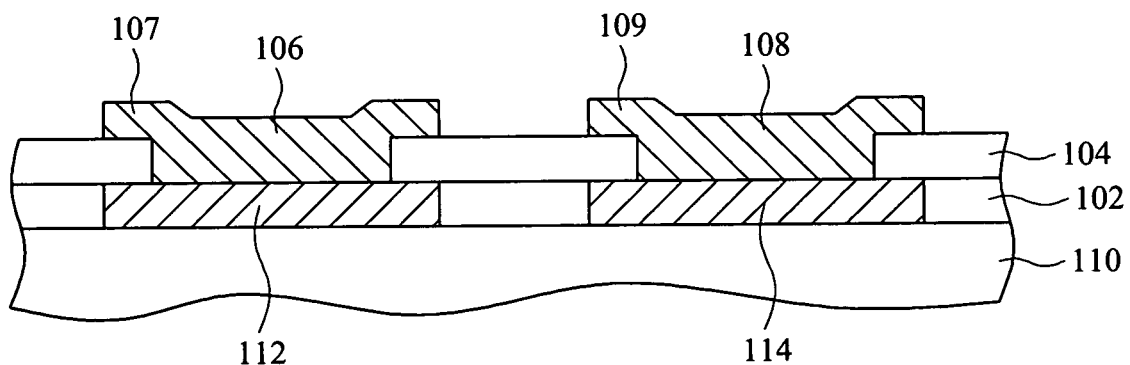
FIG. 1 shows a cross-sectional view of prior art bond pads having aluminum caps disposed thereon, wherein the edges of the aluminum caps extend over a passivation layer top surface at an edge region of the aluminum caps.
Figure 2:
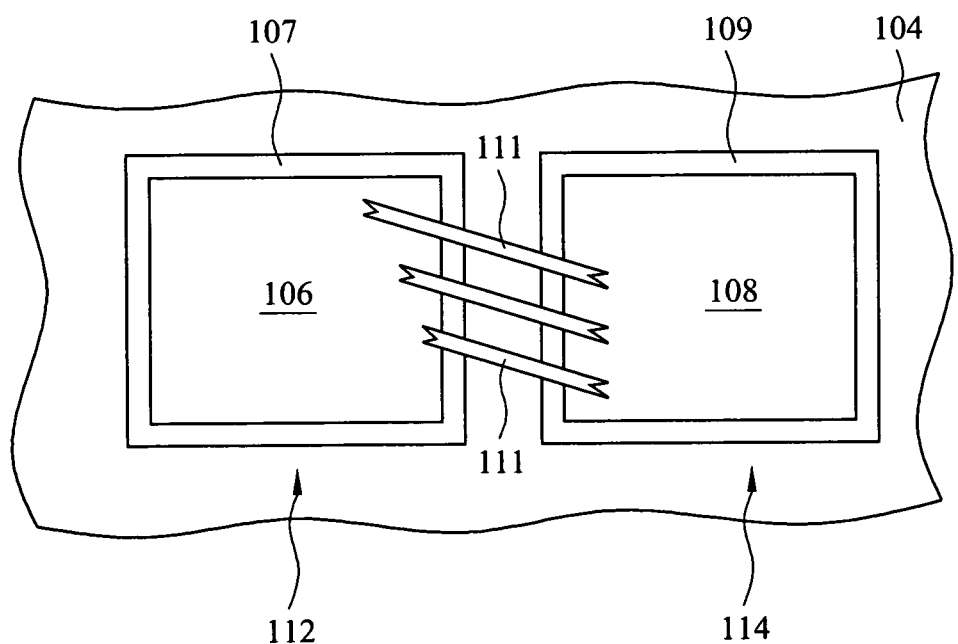
FIG. 2 shows a top view of the bond pads shown in FIG. 1, wherein shorts are formed by dislodged material from scratches in the aluminum caps over the bond pads.

Preferably, in one embodiment, when the optional barrier layers 218 and 220 are used, the barrier layers 218 and 220 are not removed from over the top surface of the passivation layer 216, but rather, are left remaining over the top surface of the passivation layer 216 proximate the opening over the bond pads. The barrier layer portions 218 and 220 are thin, e.g., about 0.01 μm to about 0.1 μm thick, and thus will not cause bridging or shorting, as prior art aluminum caps that extend above the top surface of top insulating layer can, with thicker and softener aluminum metal (as shown and described with reference to prior art FIG. 2).

Advantages of embodiments of the invention include providing a cost savings, by avoiding the need for a second passivation layer or polyimide re-passivation coating over the passivation layer 216. No additional masks are required, because the conductive cap material 222/224 and optional barrier layer material 218/220 are patterned using a single lithography mask. The isotropic etch process 226 used to remove a top portion of the conductive caps 222 and 224 from over the top surface of the passivation layers 218 and 220, respectively, does not require the use of a lithography mask. No portions of the recessed conductive caps 222" or 224" are exposed above the passivation layer 216 and thus, the recessed conductive caps 222" and 224" are not subject to scratching or damage. Furthermore, because the conductive caps 222" and 224" are recessed, the conductive caps 222" and 224" are not subject to distortion during probing, and there is no pad bridging during handling, wire-bonding, or transportation. The conductive cap 222" or 224" may be used for testing with a probe, or may be used for wire-bonding, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece, the workpiece having at least one conductive pad with an overlying passivation layer;
   forming an opening in the passivation layer, thereby at least partially exposing the at least one conductive pad, the passivation layer having a top surface and the opening in the passivation layer having sidewalls;
   forming a barrier layer over the at least one conductive pad, wherein the barrier layer lines the sidewalls of the opening in the passivation layer and is disposed over a top portion of the passivation layer proximate the opening such that the barrier layer has a top surface over the top surface of the passivation layer;
   forming a conductive cap over the barrier layer within the opening in the passivation layer, the conductive cap completely filling the opening; and
   recessing the conductive cap to a height below the top surface of the passivation layer and the top surface of the barrier layer.

2. The method according to claim 1, wherein recessing the conductive cap comprises an isotropic etch process.

3. The method according to claim 1, wherein recessing the conductive cap comprises a spray wet etch process.

4. The method according to claim 1, wherein recessing the conductive cap comprises an etch process using $H_3PO_4$ or $HNO_3$.

5. The method according to claim 4, wherein the etch process comprises $H_3PO_4$ or $HNO_3$ acid at a concentration of about 12% to 25% with deionized water.

6. The method according to claim 4, wherein the etch process comprises a temperature of about 25 to 95° C.

7. The method according to claim 4, wherein the etch process comprises a time of about 60 to 300 seconds.

8. The method according to claim 1, wherein forming the conductive cap comprises forming aluminum, and wherein the at least one conductive pad comprises copper.

9. The method according to claim 1, wherein forming the conductive cap comprises forming about 2 μm or less of aluminum, and wherein recessing the conductive cap comprises recessing the conductive cap to a height of about 5000 Å or less below the top surface of the passivation layer.

10. The method according to claim 1, wherein forming the barrier layer comprises forming TaN or TiN.

11. The method according to claim 1, wherein forming the barrier layer comprises forming a material layer having a thickness of about 2000 Å or less.

12. The method according to claim 1, further comprising bonding a wire to the conductive cap disposed over each at least one conductive pad.

13. The method according to claim 1, wherein forming the barrier layer and forming the conductive cap comprise:
   depositing a barrier layer material over the workpiece;
   depositing a conductive cap material over the barrier layer material; and
   patterning the conductive cap material and the barrier layer material using a single lithography mask.

14. The method according to claim 13, further comprising polishing the conductive cap material using a chemical mechanical polish (CMP) process, before or after patterning the conductive cap material and the barrier layer material.

* * * * *